United States Patent
Tsutsumi et al.

(10) Patent No.: US 9,136,405 B2
(45) Date of Patent: *Sep. 15, 2015

(54) LIGHT TRANSMISSION TYPE SOLAR CELL AND METHOD FOR PRODUCING THE SAME

(75) Inventors: Eishi Tsutsumi, Kawasaki (JP); Kumi Masunaga, Kawasaki (JP); Ryota Kitagawa, Tokyo (JP); Tsutomu Nakanishi, Tokyo (JP); Akira Fujimoto, Kawasaki (JP); Hideyuki Nishizawa, Tokyo (JP); Koji Asakawa, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 578 days.

This patent is subject to a terminal disclaimer.

(21) Appl. No.: 12/700,063

(22) Filed: Feb. 4, 2010

(65) Prior Publication Data

US 2010/0236619 A1   Sep. 23, 2010

(30) Foreign Application Priority Data

Mar. 18, 2009   (JP) .................................. 2009-066169

(51) Int. Cl.
*H01L 31/00*   (2006.01)
*H01L 31/18*   (2006.01)
(Continued)

(52) U.S. Cl.
CPC .. *H01L 31/022433* (2013.01); *H01L 31/03921* (2013.01); *H01L 31/075* (2013.01); *H01L 31/1884* (2013.01); *Y02E 10/548* (2013.01)

(58) Field of Classification Search
CPC ................ H01L 31/022433; H01L 31/03921; H01L 31/1884; H01L 31/074; Y02E 10/548
USPC ......................................... 136/255, 256, 252
See application file for complete search history.

(56) References Cited

U.S. PATENT DOCUMENTS 4,795,500 A * 1/1989 Kishi et al. .................... 136/244
5,334,259 A * 8/1994 Mizumura et al. ............ 136/258

(Continued)

FOREIGN PATENT DOCUMENTS

JP   2-312285   12/1990
JP   5-145096    6/1993

(Continued)

OTHER PUBLICATIONS

Reilly, III et al., "Surface plasmon enhanced transparent electrodes in organic photovoltaics", Applied Physics Letters, 2008.*

(Continued)

*Primary Examiner* — Matthew Martin
(74) *Attorney, Agent, or Firm* — Oblon, McClelland, Maier & Neustadt, L.L.P.

(57) ABSTRACT

The present invention provides a light transmission type solar cell excellent in both power generation efficiency and light transparency, and also provides a method for producing that solar cell. The solar cell of the present invention comprises a photoelectric conversion layer, a light-incident side electrode layer, and a counter electrode layer. The incident side electrode layer is provided with plural openings bored through the layer, and has a thickness of 10 nm to 200 nm. Each of the openings occupies an area of 80 $nm^2$ to 0.8 $\mu m^2$, and the opening ratio is in the range of 10% to 66%. The transmittance of the whole cell is 5% or more at 700 nm wavelength. The incident side electrode layer can be formed by etching fabrication with a stamper. In the etching fabrication, a monoparticle layer of fine particles or a dot pattern formed by self-assembled block copolymer can be used as a mask.

6 Claims, 6 Drawing Sheets

(51) Int. Cl.
 *H01L 31/0224* (2006.01)
 *H01L 31/0392* (2006.01)
 *H01L 31/075* (2012.01)

(56) References Cited

U.S. PATENT DOCUMENTS

| | | | |
|---|---|---|---|
| 6,441,298 B1 * | 8/2002 | Thio | 136/250 |
| 2005/0266693 A1 | 12/2005 | Maekawa | |
| 2008/0142075 A1 * | 6/2008 | Reddy et al. | 136/257 |
| 2008/0308151 A1 * | 12/2008 | Den Boer et al. | 136/256 |
| 2009/0079322 A1 | 3/2009 | Tsutsumi et al. | |
| 2009/0211783 A1 | 8/2009 | Tsutsumi | |
| 2009/0297693 A1 | 12/2009 | Katsuhara et al. | |

FOREIGN PATENT DOCUMENTS

| | | |
|---|---|---|
| JP | 2001-151834 | 6/2001 |
| JP | 2002-76410 | 3/2002 |
| JP | 2003-160883 A | 6/2003 |
| JP | 2005-230947 | 9/2005 |
| JP | 2006-19707 A | 1/2006 |
| JP | 2008-275526 A | 11/2008 |
| JP | 2008-309629 A | 12/2008 |

OTHER PUBLICATIONS

Ferry et al., "Plasmonic Nanostructure Design for Efficiency Light Coupling into Solar Cells", Nano Letters, Oct. 2008.*
Japanese Office Action issued Mar. 16, 2012 in Patent Application No. 2009-066169 with English Translation.
Thomas H. Reilly III et al., "Surface-plasmon Enhanced Transparent Electrodes in Organic Photovoltaics", Applied Physics Letters, vol. 92, No. 24, Jun. 17, 2008, pp. 243304-1-243304-3.
U.S. Appl. No. 12/706,338, filed Feb. 16, 2010, Nakanishi, et al.
U.S. Appl. No. 13/216,977, filed Aug. 24, 2011, Masunaga et al.
U.S. Appl. No. 13/221,319, filed Aug. 30, 2011, Masunaga et al.
U.S. Appl. No. 12/441,036, filed Mar. 12, 2009, Tsutsumi, et al.
Office Action issued Jan. 8, 2013, in Japanese Patent Application No. 2009-066169, with English-language Translation.
Office Action issued Apr. 11, 2014 in Japanese Patent Application No. 2009-66169 (with English language translation).
Office Action issued Jan. 7, 2014, in Japanese Patent Application No. 2009-66169 with English translation.
D. Derkacs, et al., "Improved performance of amorphous silicon solar cells via scattering from surface plasmon polaritons in nearby metallic nanoparticles", Applied Physics Letters, vol. 89, Aug. 28, 2006, 1 front page, pp. 093103-1 to 093103-3.
Office Action issued Jul. 1, 2014 in Japanese Patent Application No. 2009-66169 (with English language translation).

* cited by examiner

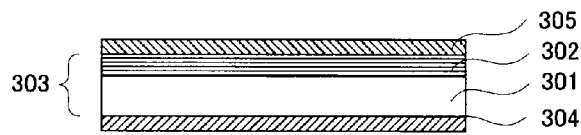
Fig. 3A
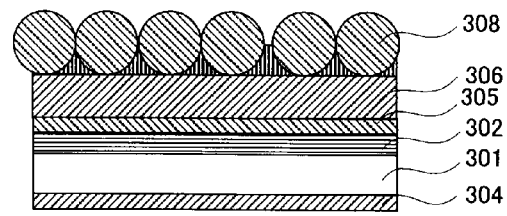
Fig. 3E
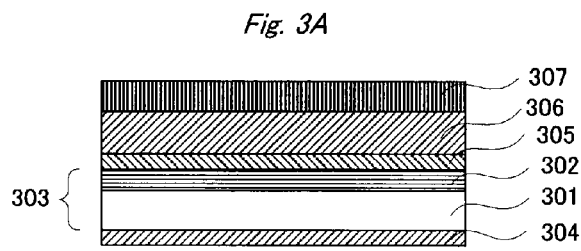
Fig. 3B
Fig. 3F
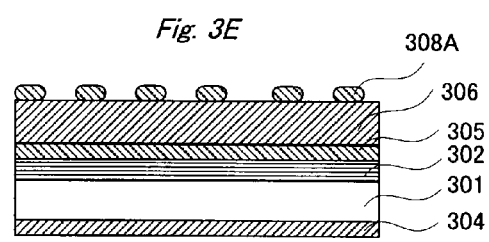
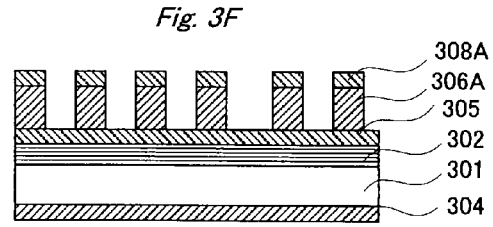
Fig. 3G
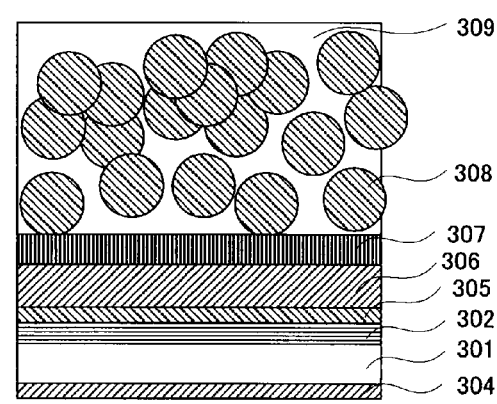
Fig. 3C
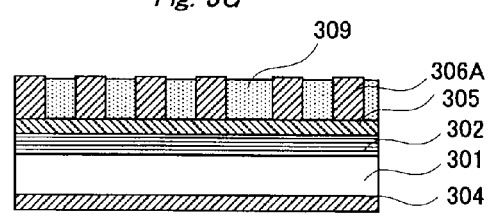
Fig. 3H
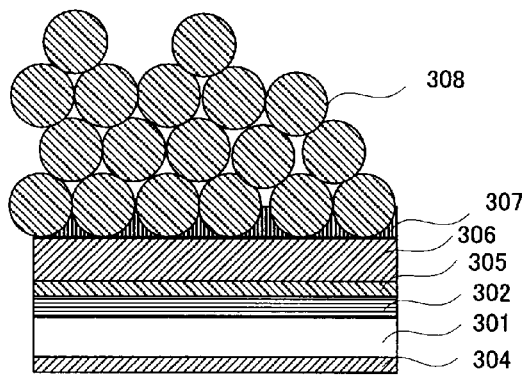
Fig. 3D
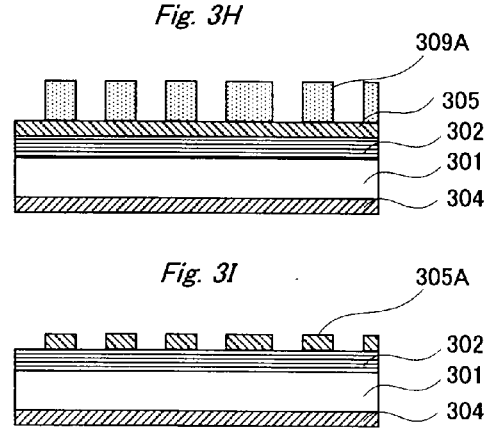
Fig. 3I
Fig. 3J

LIGHT TRANSMISSION TYPE SOLAR CELL AND METHOD FOR PRODUCING THE SAME

CROSS-REFERENCE TO RELATED APPLICATIONS

This application is based upon and claims the benefit of priority from the prior Japanese Patent Application No. 2009-66169, filed on Mar. 18, 2009; the entire contents of which are incorporated herein by reference.

BACKGROUND OF THE INVENTION

1. Field of the Invention

This invention relates to a light transmission type solar cell, particularly relates to a solar cell of high transparency comprising a light transmission type metal electrode. Further, the present invention also relates to a method for producing that solar cell.

2. Background Art

Solar light energy shining onto the whole earth is said to be a hundred thousand times as large as the electric power that the whole word consumes, and hence we are already surrounded with a huge energy resource even if especial industrial activities are not performed. In order to effectively exploit this huge energy resource, there have hitherto been developed techniques for solar cells utilizing the solar light energy. Solar cells convert the solar light energy into electric energy, which is convenient for human beings to use, and are therefore regarded as important key devices for solving the energy exhaustion problem discussed recently.

Meanwhile, solar cells manufactured at present are categorized into two types, namely, silicon (Si) type and compound semiconductor type. The silicon type solar cells are further categorized, depending on the constitution of silicon layers formed therein, into four types such as single crystal silicon type, poly-silicon type, amorphous silicon type, and crystallite silicon type. According to the structures thereof, they are also categorized into laminate type (tandem type), thin-film silicon type, hybrid type and others. Those kinds of silicon type solar cells thus categorized are different from each other in various aspects such as conversion efficiency, cost and processing performance, and hence are properly selected depending on the use, setting place and the like.

From the viewpoints of cleanness and safety, solar cells as sustainable energy sources are one of the notable objects of studies still drawing attention of people in $21^{st}$ century. For example, there are studied solar cells that have additional values such as flexibility in addition to the basic function of generating electricity when exposed to sunshine. Besides the flexible solar cells, examples of those additional-valued solar cells also include a light transmission type solar cell, which generates electricity from sunshine and simultaneously which transmits solar rays. This type of solar cell is also referred to as "see-through solar cell". Since this type solar cell itself is semi-transparent, it not only generates electricity but also transmits sunlight moderately when set on a window or the like of a building. The light transmission type solar cell is therefore expected to have effects of reducing the amount of direct sunlight into rooms and of improving cooling efficiency in buildings.

On the other hand, however, since solar cells are fundamentally devices for absorbing and converting light into electric energy, they preferably absorb a large amount of light. Accordingly, in view of power generation efficiency, solar cells are preferably not transparent and hence generally they hardly transmit light. For this reason, in conventional techniques, a module including a solar cell is partly subjected to laser scribing or punching to form openings or otherwise plural solar cells in a module are arranged at intervals in order that light can penetrate through the openings or intervals and thereby that the module as a whole can be transparent. However, there is evidently a trade-off relation between the opening ratio (area ratio of the openings to the light incident surface) and the power generation efficiency. In fact, a practical solar module can have an opening ratio of 10% to 20% at the most. This opening ratio, however, provides such insufficient transparency that the module obviously looks dark. There is, therefore, room for improvement in lighting.

To cope with the above problem, there is proposed a solar cell transparent itself. For producing that solar cell, both a light-incident side electrode layer and a counter electrode layer, between which a photoelectric conversion layer is placed, are normally made of transparent metal oxide such as ITO (indium tin oxide) without forming the openings or intervals. In JP-A 1990-312285 (KOKAI), for example, an ITO electrode layer is formed on each of the top and bottom surfaces of an amorphous silicon layer to produce a light transmission type solar cell. However, a transparent electrode layer made of an oxide such as ITO generally has a smaller electroconductivity than a metal electrode by two orders of magnitude. Accordingly, in order that the oxide electrode layer can have an electroconductivity comparable to that of the metal electrode, it is inevitably necessary to thicken the oxide layer considerably. However, the thickened oxide layer generally gives a photoelectric conversion efficiency as small as 1% or less, and hence further studies are needed for putting the oxide layer to practical use. In order to improve this problem, JP-A 1993-14096 (KOKAI) proposes a solar cell in which an electrode on the light-receiving side of an amorphous silicon layer is made of ITO but in which the other electrode on the opposite side has a laminate structure comprising a thin semi-transparent metal layer and a transparent electroconductive metal oxide layer. This solar cell has a conversion efficiency of approx. 7 to 8%, and hence is improved in conversion efficiency as compared with the above conventional solar cell. However, from the viewpoint of transparency, the proposed solar cell has a light-transmittance as small as approx. 10% at the wavelength of 700 nm although having a relatively large transmittance of approx. 28% at the wavelength of 800 nm. Accordingly, there is still room for improvement in light-transparency in the visible range although that solar cell has improved light-transparency in the infrared range, in which human eyes have low sensitivity to light.

As described above, it still cannot be clearly said that the light transmission type solar cell makes a breakthrough in the trade-off relation between the light-transmission and the power generation efficiency. It is, therefore, desired to provide a novel solar cell technique capable of making a breakthrough in the trade-off relation between the opening ratio and the power generation ability.

SUMMARY OF THE INVENTION

An embodiment of the present invention resides in a solar cell which comprises a photoelectric conversion layer comprising at least p-type semiconductor and n-type semiconductor, a light-incident side electrode layer formed on a light-incident surface of said photoelectric conversion layer, and a counter electrode layer formed on the surface opposite to the light-incident surface; wherein said light-incident side electrode layer and/or said counter electrode layer has plural openings bored though the layer, and the thickness thereof is in the range of 10 nm to 200 nm, each of said openings occupies an area of 80 nm$^2$ to 0.8 µm$^2$, and the opening ratio is in the range of 10% to 66%, said opening ratio being defined as the ratio of the total area of the openings based on that of said layer having plural openings, and light of 700 nm wavelength can penetrate in a transmittance of 5% or more from said light-incident side electrode layer to said counter electrode layer.

Another embodiment of the present invention resides in a method for producing the above solar cell, comprising the steps of: forming a photoelectric conversion layer, forming a light-incident side electrode layer on a light-incident surface of said photoelectric conversion layer, and forming a counter electrode layer on the surface opposite to the light-incident surface of said photoelectric conversion layer; wherein the step of forming said light-incident side electrode layer further comprises the sub-steps of:

forming a thin metal layer, coating a resist composition on at least a part of said thin metal layer, to form a resist layer, forming a mono-particle layer of fine particles on said resist layer, etching said resist layer by use of said mono-particle layer as an etching mask, to form a resist pattern, filling openings in said resist pattern with inorganic substance, to form a reverse pattern mask, and etching said thin metal layer by use of said reverse pattern mask as an etching mask, to form a light-incident side electrode layer having fine openings.

Still another embodiment of the present invention resides in a method for producing the above solar cell, comprising the steps of: forming a photoelectric conversion layer, forming a light-incident side electrode layer on a light-incident surface of said photoelectric conversion layer, and forming a counter electrode layer on the surface opposite to the light-incident surface of said photoelectric conversion layer; wherein the step of forming said light-incident side electrode layer further comprises the sub-steps of:

forming a thin metal layer, coating a block copolymer-containing composition on at least a part of said thin metal layer, to form a block copolymer layer, causing phase separation of said block copolymer, to form microdomains in a dot pattern, and etching said thin metal layer by use of said dot pattern of microdomains as an etching mask, to form a light-incident side electrode layer having fine openings.

Yet another embodiment of the present invention resides in a method for producing the above solar cell, comprising the steps of: forming a photoelectric conversion layer, forming a light-incident side electrode layer on a light-incident surface of said photoelectric conversion layer, and forming a counter electrode layer on the surface opposite to the light-incident surface of said photoelectric conversion layer; wherein the step of forming said light-incident side electrode layer further comprises the sub-steps of:

forming a thin metal layer, preparing a stamper whose surface has a fine relief pattern corresponding to the shape of the light-incident side electrode layer intended to be formed, transferring a resist pattern onto at least a part of said thin metal layer by use of said stamper, and etching said thin metal layer by use of said resist pattern as an etching mask, to form a light-incident side electrode layer having fine openings.

The present invention employs a nano-fabricated metal thin film as a metal electrode in a solar cell, and thereby succeeds in providing a light transmission type solar cell comprising a light transmission type metal electrode of high transparency with low resistance. In a conventional solar cell, the power generation efficiency deteriorates if the photoelectric conversion layer is thinned down. In contrast, however, in the present invention, the power generation efficiency is kept from deteriorating even if the conversion layer is thinned down, so that a light transmission type solar cell of high transparency can be provided.

BRIEF DESCRIPTION OF THE DRAWINGS

FIGS. 3A to 3J show schematic sectional views illustrating a process for producing a solar cell according to an embodiment of the present invention.

DETAILED DESCRIPTION OF THE INVENTION

Embodiments of the present invention are explained below in detail.

Differing from a conventional light transmission type solar cell module simply provided with "openings" or "intervals" which light penetrates through, the solar cell of the present invention comprises a metal electrode having such a particular structure as realizes both high transparency and high power generation efficiency.

In order to make a solar cell transparent, it is generally necessary to thin down the photoelectric conversion layer considerably and, as a result, it is difficult to absorb light enough to generate sufficient power. In contrast, however, the present inventors have found that high power generation efficiency can be obtained by use of a metal electrode having a particular structure even if the photoelectric conversion layer is considerably thinned down. This effect is due to the particular structure of the electrode, which is a thin metal film provided with very fine openings. It is presumed that edges of the openings play an important role in this effect.

With respect to the above effect, detailed explanation is described below.

Figure 1:
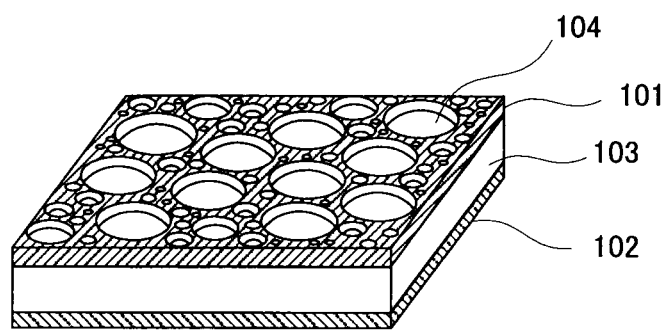
FIG. 1 is a conceptual sketch of a solar cell according to an embodiment of the present invention.

FIG. 1 illustrates the structure of a solar cell according to an embodiment of the present invention. The solar cell shown in FIG. 1 comprises a light-incident side electrode 101, a counter electrode 102, and a photoelectric conversion layer 103 placed between them. As the photoelectric conversion layer usable for a solar cell, various types are known and any of them can be selected to use. Examples of the types include pn-junction type and pin type. In the present invention, a pin type photoelectric conversion layer is preferred in view of increasing light absorption. The solar cell according to an embodiment of the present invention is partly characterized in that the light-incident side electrode 101 formed on the light-incident surface is a thin metal film having openings 104 in a mesh structure.

Figure 2:
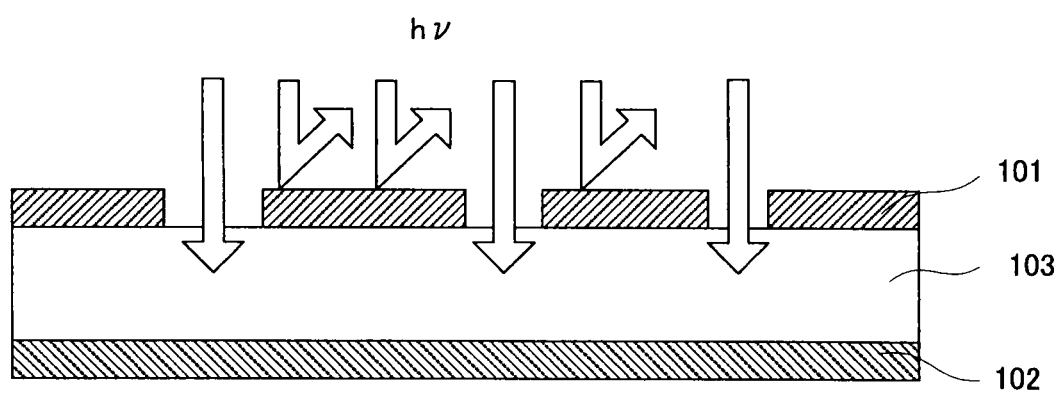
FIG. 2 is a schematic sectional view of a solar cell according to an embodiment of the present invention.

FIG. 2 schematically shows a vertical sectional view of the solar cell shown in FIG. 1. As illustrated in FIG. 2, since the light-incident side electrode 101 is made of metal, the photoelectric conversion layer in the areas covered with the metal does not transmit light and the light coming to those areas is reflected. Consequently, the light penetrates only through the openings and reaches the photoelectric conversion layer in the areas not covered. This means that the photoelectric conversion layer generally receives light in an amount corresponding to the area ratio of the openings based on the whole electrode surface. The photoelectric conversion layer is therefore generally thought to generate electric current in proportion to the amount of the received light.

Surprisingly, however, the present inventors have actually found that the light-incident side electrode having the particular structure enables to increase the electric current more than expected from the amount of light received by the photoelectric conversion layer.

Light is a kind of electromagnetic wave, and travels in accordance with Maxwell's equations. On the other hand, since containing free electrons, metals in solid state generally have negative dielectric constants and hence have property of reflecting light. Accordingly, if metals are adopted as materials of the electrodes with intent to utilize their high electroconductivity, it is inevitably necessary that the electrodes be made thin enough to keep high light-transmittance. As a result, the obtained electrodes are generally not fully stabilized in the electroconductivity and other qualities.

However, in the cases where openings are provided on a metal film and where that metal film is irradiated with a plane wave, an electric field component different from the components of the incident plane wave is newly induced at the edges of the openings. This phenomenon is explained blow. The following description includes a simulation for clearly explaining the phenomenon.

As one of the simulation methods numerically solving Maxwell's equations, finite difference time domain (FDTD) method is known. This method enables to analyze the phenomenon in nano-areas.

By use of the FDTD method, the electric field-enhancement effect given by the metal electrode of the present invention can be considered as follows.

First, a three-dimensional calculation domain is defined. A metal electrode having the particular structure according to the present invention is then supposed to be formed on a substrate and to be positioned in the calculation domain. If the traveling direction of light (electromagnetic field) is placed along the Z axis, the incident light can be regarded as a simply polarized TE wave only having an electric field composition Ex and a magnetic field composition Hy.

A simulation under the above assumption is calculated. As a result, it is found that a new electric field component Ez along the Z axis appears in areas very close to the edges of the openings immediately when the plane wave reaches the metal electrode having the particular structure. This electric field component by no means appears in a conventional electrode. The above electric field component becomes stronger according as positioned nearer to the metal. On the other hand, in accordance with increasing the distance from the metal, this electric field rapidly attenuates. The strength of the newly appearing electric field is more than a several times as large as that of the incident electric field. The reason why the power generation efficiency is improved in the solar cell of the present invention is thought to be because the above component Ez enhances the electric field contributing to the photoelectric conversion. In view of that, it is considered, as described below, what mechanism works to generate the electric field Ez at the edges.

Conceptual explanation of why the electric field Ez appears at the edges of the openings is thought to be as follows.

(1) The electric field of incident light received by the metal electrode induces free electrons to cause plasma oscillation.

(2) The openings disturb the oscillation, so that the free electrons are distributed not uniformly to cause uneven polarization.

(3) As a result, the unevenness of electron density distribution causes a new electric field at the edges.

(4) The phases of the electric field thus caused at both ends of each edge are different from each other in positive/negative, and this difference is periodically repeated like oscillation of electric dipoles to cause an electromagnetic wave including a component parallel to the surface. The electric field is thus thought to be enhanced at the edges of the electrode.

Since the simulation employing the FDTD method is calculated only according to Maxwell's equations, the above phenomenon can be also explained on the basis of Maxwell's equations.

The incident light is a plane wave of TE (Ex, Hy) polarization, and hence the electric field Ez along the traveling direction is not generated in a general electrode. However, in the simulation, the electric field is generated at the edges of the metal electrode having the particular structure of the present invention. This means that the term dEz/dt is not equal to zero in the metal electrode of the present invention. According to Maxwell's equations, the term dEz/dt is expressed by the formula:

$$dEz/dt = 1/\in \cdot (\partial Hy/\partial x - \partial Hx/\partial y)$$

wherein $\in$ is a dielectric constant of the metal.

In the above formula, the second term in the right side is zero and negligible because the TE-polarized plane wave does not have the Hz component. Further, since the Hy is a wave traveling in the Z direction, it has no variation along the X axis. Accordingly, the term ∂Hy/∂x is equal to zero. As a result, the electric field Ez is thought not to appear in the traveling TE wave.

However, at the edges of the openings, there is an interface Al/air or Al/quartz, where the dielectric constant $\in$ changes discontinuously. The electric field Ex, therefore, attenuates rapidly because of dielectric loss of the metal. Accordingly, since ∂Hy/∂t depends on dEz/dt, the magnetic field Hy also decreases. At the same time, the electromagnetic field slightly entering the metal is slowed down in proportion to the refractive index, while the magnetic field penetrating through the openings travels independently from the dielectric constant of the metal. As a result, the magnetic field Hy penetrating through the openings is thought to differ both in strength and in phase from the Hy slightly entering the metal.

The term ∂Hy/∂x (which corresponds to ΔHy/Δx in difference approximation of the FDTD method) in the above formula thus becomes not zero at the interface between each opening and the metal. Accordingly, it is thought that the term dEz/dt also becomes not zero and consequently that the electric field Ez is generated.

Theoretically, the electric field Ez is presumed to be generated in the metal as well as in air or quartz. However, since the real and imaginary parts of the dielectric constant are both high in the metal, the dEz/dt in the metal is too small to generate the electric field.

Subsequently, time variation of the electric field Ez is described below. The Ez is thus caused by the TE plane wave traveling with the oscillation of exp(iωt), and hence it varies according to the oscillation.

Although the Ez phases at the edges of metal electrode part ends are completely opposite to each other, they oscillate almost synchronously with the incident Ex electric field in the incident light at the opening.

Because of the induced Ez electric field thus oscillating, another Maxwell's equation including Ez can be considered in addition to the above equation. That is:

$$dHy/dt = -1/\mu \cdot (\partial Ez/\partial x - \partial Ex/\partial z)$$

wherein μ is a magnetic permeability of the metal.

Based on the above relations, the incident plane wave induces the Ez electric field at the edges of the openings bored through the metal electrode, and consequently generates an electromagnetic wave which contains the Ez component, which is not a plane wave (namely, in which $\partial Ez/\partial t$ is not equal to zero) and which penetrates through the openings.

In the meantime, a silicon type solar cell comprises a photoelectric conversion layer mainly made of silicon, which is an indirect transition semiconductor. The silicon type solar cell, therefore, generally has a small absorption coefficient as compared with a cell employing a direct transition semiconductor. This is because the indirect transition semiconductor has a band structure in which the upper limit of valence band is not corresponding to the lower limit of conduction band in K space. For this reason, in order to increase light-absorption of the photoelectric conversion layer, it is necessary to provide, for example, a built-in potential of pn-junction.

If the metal electrode having the particular structure of the present invention is formed on a silicon layer, the electric field is remarkably enhanced at each of the numerous opening edge interfaces. This enhancement is thought to work on the pn-junction and consequently to increase the light absorption efficiency. In other words, the enhanced electric field is thought to increase an apparent absorption coefficient of the silicon layer or to promote absorption of incident photons.

From the above-described presumption, it can be said that the solar cell of the present invention is improved in power generation efficiency by the enhancement of electric field at the edges of the openings bored through the metal electrode. In the solar cell according to the present invention, therefore, even a thin photoelectric conversion layer can generate a sufficient amount of electricity. Accordingly, it becomes possible to improve the efficiency of a light transmission type solar cell. Further, this technique can be also expected to be of some help to solve the problem of Si resource exhaustion, which will be serious in the future.

As described above, the light transmission type solar cell improved in power generation efficiency must have a particular structure, which is described below in detail.

First, with respect to the light-incident side metal electrode, the structure thereof is explained. The light-incident side electrode layer according to the present invention is provided with openings bored through the layer, and the sizes and placement of the openings are particularly restricted in the present invention.

As one of the restrictions, the distance between two adjacent openings, namely, the length of unbroken metal electrode part between two adjacent openings is preferably 10 nm to 200 nm, more preferably 30 nm to 100 nm in average. This is because, if the average distance is less than 10 nm, dipoles appearing at both ends of a single electrode part are cancelled out by each other and hence are incapable of enhancing the electric field. On the other hand, if the average distance among the openings is more than 200 nm, the dipoles do not interact with each other and hence the electric field has constant strength. Further, also from the viewpoint that the electrode must have sufficient electroconductivity, the distance among the openings is preferably 10 nm or more.

The light-incident side metal electrode preferably has openings occupying large areas in consideration of light transparency. On the other hand, however, in view of electroconductivity, the openings preferably occupy small areas. Form both viewpoints, the ratio of the total area of the openings based on that of the incident side metal electrode layer, namely, the opening ratio, is required to be in the range of 10% to 66%, and preferably in the range of 25% to 66%.

Under the condition that the distance among the openings is within the above range, the total length of the edges, namely, the total peripheral length of the openings is preferably long enough to further enhance the electric field per unit area. For example, if the openings are circles having the same diameters and are periodically placed, the number of the openings can be increased and accordingly the total peripheral length can be extended by shorting the distance among the openings, so as to strengthen the electric field-enhancement effect. On the other hand, if the openings are circles and are so periodically placed that the distances among the openings are the same, the number of the openings can be increased and accordingly the total peripheral length can be extended by reducing the opening diameters, so as to strengthen the electric field-enhancement effect.

The openings are, however, not necessarily placed periodically, and may be positioned in any arrangement such as periodical, pseudo-periodical or random arrangement. Since the openings in any arrangement can provide the effect of the present invention, there is no particular restriction on how periodically the openings are arranged. The shapes of the openings are also not restricted to circles. In view of the electric field-enhancement effect, star-shaped or figure-C-shaped openings are advantageous rather than circular ones because the total peripheral length of those openings is longer than that of circular openings. On the other hand, however, circular openings have the advantage of easily producing the electrode.

As described above, the electric field-enhancement effect depends on the distance among the openings and on the shapes thereof. However, each of the openings needs to occupy an area of 80 nm$^2$ to 0.8 μm$^2$, preferably 1000 nm$^2$ to 0.03 μm$^2$. If the openings are circles in shape, the opening diameter (diameter of opening) is preferably 10 nm to 1000 nm, more preferably 30 nm to 200 nm. If the opening diameter is within this range, the maximum electric field-enhancement effect can be obtained in the wavelength range of sunlight. This is preferred in consideration that the solar cell of the present invention utilizes sunlight.

Further, the light-incident side metal electrode layer needs to have a thickness of 10 nm to 200 nm. If the thickness is less than 10 nm, the metal layer has too high a resistance to keep sufficient electroconductivity and accordingly the photoelectric conversion efficiency is lowered. It is, therefore, unfavorable. On the other hand, if the thickness is more than 200 nm, the photoelectric conversion layer is often incapable of benefiting from the electric field-enhancement effect sufficiently to improve the conversion efficiency. It is, therefore, also unfavorable.

As described above, the particular structure of the incident side electrode enhances the electric field at the edges of the electrode (peripheral areas of the openings). This electric field-enhancement effect works on a depletion layer, and thereby the photoelectric conversion efficiency is improved. The depletion layer is, therefore, necessarily placed within a short distance from the incident side electrode. Accordingly, the depletion layer is at least partly positioned within a distance of preferably 1 μm or less, more preferably 500 nm or less, most preferably 300 nm or less from the contact surface between the light-incident side electrode and the photoelectric conversion layer. Here, the "depletion layer" means an area where charge separation is caused by light irradiation to generate electrons and holes. The depletion layer is placed near the pn junction interface in a pn junction type photoelectric conversion layer. On the other hand, in a pin type photoelectric conversion layer, the depletion layer is centered at the i layer and extended from the p layer to the n layer.

In the above description, the solar cell according to an embodiment of the present invention is explained from the viewpoint of the structure. The solar cell can be structured of any known materials, which can be freely selected to use.

The light-incident side metal electrode in the present invention can be made of any known metal, which can be freely selected to use. Here, the "metal" means a material which is an electroconductive simple substance, which has metallic gloss, which has malleability, which consists of metal atoms and which is solid in room temperature; or an alloy thereof. In an embodiment of the present invention, the metal electrode is preferably made of a material having a higher plasma frequency than the incident light. Further, the material preferably absorbs light in the wavelength range intended to be used. Examples of the material include aluminum, silver, gold, platinum, nickel, cobalt, chromium, copper, and titanium. Among them, preferred are aluminum, silver, platinum, nickel and cobalt. However, these examples by no means restrict the material as long as the material is a metal having a higher plasma frequency than the incident light. This means that it is unnecessary to use rare metals such as indium and hence that typical metal materials are usable in the present invention.

In a solar cell most popularly used at present, the photoelectric conversion layer comprises p-type semiconductor and n-type semiconductor. Accordingly, also in the solar cell according to the present invention, the conversion layer preferably comprises p-type and n-type semiconductors so that it can be produced easily at low cost. In view of availability, the semiconductor is preferably silicon such as single crystal silicon, poly-crystal silicon or amorphous silicon. For example, layers of p-type crystal silicon and n-type crystal silicon are laminated to form a pn-junction type photoelectric conversion layer. The p-type/n-type crystal silicon may be in any form such as single crystal, poly-crystal or fine crystallite. The single crystal silicon has the advantage of high photoelectric conversion efficiency, while the poly-crystal silicon has the advantage of low production cost. Further, it is also possible to use a pin-junction type photoelectric conversion layer in which layers of p-type amorphous silicon, i-type undoped amorphous silicon and n-type amorphous silicon are laminated in order. This photoelectric conversion layer has the advantages that it can be produced at low cost and that the output power is hardly lowered even at a high temperature. The thickness of the photoelectric conversion layer depends on the light-absorption of the layer and on the light-transmittance of the whole solar cell. However, if the conversion layer comprises crystalline silicon such as single crystal silicon or poly-crystal silicon, the thickness is preferably 20 to 200 nm. If the conversion layer comprises amorphous silicon, the thickness is preferably 10 to 500 nm.

The material of the photoelectric conversion layer is not restricted to silicon, and may be a compound semiconductor such as GaAs or CIS type semiconductor. The structure of the conversion layer is also not restricted to a laminate type, and may be a hetero-junction type, a fine particle type, a tandem type, a dot type or a junction type. In the present invention, there is no particular restriction on the structure of the photoelectric conversion layer.

The counter electrode may be made of any material as long as it can have an ohmic contact with the contiguous semiconductor. For example, oxide materials such as ITO, which is generally used, are employable. The light-incident side metal electrode and the counter electrode may be made of the same material.

In the solar cell of the present invention, the light transmission type electrode having the particular structure according to the present invention can be used as the counter electrode placed on the side opposite to the light-incident side. In that case, the electrode on the light-incident side may be a transparent electrode of oxide such as ITO, AZO or TFO. The counter electrode in this solar cell has a function of transmitting light, particularly, visible light in a large amount. In a see-through solar cell generally used at present, the electrode is partly removed, for example, by shaving so as to transmit light. The electrode thus treated becomes transparent in a degree corresponding to the removed amount, but loses the power generation ability in the same degree. In contrast, if the light transmission type electrode of the present invention is used as the counter electrode, the transparency on the back side is ensured and accordingly the light-transmittance of the see-through solar cell can be improved without lowering the power generation efficiency.

The light transmission type solar cell according to an embodiment of the present invention can be set on a transparent substrate such as a window. In that case, since incident light comes from both sides of the photoelectric conversion layer, the light-incident side electrode layer may be formed on either side. Further, the metal electrode having the particular structure of the present invention can be formed on each side. The solar cell having that structure is preferred not only because the effect of the invention can be obtained no matter which side the incident light comes from but also because the light transparency can be improved as compared with a solar cell comprising the counter electrode of ITO or the like.

The light transmission type solar cell according to an embodiment of the present invention transmits light of 700 nm wavelength in a transmittance of 5% or more, preferably 10% or more from the light-incident side electrode to the counter electrode. This transmittance cannot be obtained in a conventional solar cell. As described above, the solar cell according to an embodiment of the present invention can be set on a window or the like, so as to light a room and to generate electric power at the same time. In view of that, the solar cell preferably transmits light not at a particular wavelength but in a wide wavelength range. Accordingly, the average light transmittance in the range of 450 nm to 750 nm is preferably 5% or more, further preferably 10% or more. As described above, the light transmittance of the solar cell depends on the photoelectric conversion layer. However, it also depends on the transmittances of the electrodes. The incident side electrode and the counter electrode, therefore, have high transmittances. The light transmittance of each electrode is preferably 5% or more at 700 nm.

Meanwhile, there are various studies for increasing the photoelectric conversion efficiency of the solar cell. For example, it has been studied to improve an antireflection layer or to modify the bottom structure of the photoelectric conversion layer. Those techniques can be combined with the solar cell according to an embodiment of the present invention unless they impair the effect of the present invention.

As another embodiment of the present invention, the method for producing the solar cell is described below.

The solar cell produced in the present invention comprises a photoelectric conversion layer, a light-incident side electrode layer formed on the photoelectric conversion layer, and a counter electrode layer formed on the surface opposite to the light-incident side. There is no particular restriction on the order of forming the layers, which may be formed by either of:

(1) a method in which the photoelectric conversion layer is formed, and then the light-incident side electrode layer is formed on one surface of the conversion layer, and finally the counter electrode layer is formed on the other surface; and (2) a method in which semiconductor is accumulated on the light-incident side electrode or on the counter electrode to form the photoelectric conversion layer, and then the counter electrode or the light-incident side electrode, respectively, is formed thereon.

The photoelectric conversion layer can be formed by any method according to the semiconductor intended to be used. For example, a substrate of p-type or n-type semiconductor is partly doped with impurities, or otherwise another semiconductor layer is formed on the substrate by vapor-deposition to form a laminate type photoelectric conversion layer. Further, the photoelectric conversion layer can be also obtained by the steps of forming an electrode layer on a transparent substrate and then laminating a p-type, n-type or i-type semiconductor layer thereon.

The solar cell according to an embodiment of the present invention is characterized by the light-incident side electrode having openings. The structure of the incident side electrode can be formed by the steps of: first forming a thin metal layer on a surface of the conversion layer, and then boring the openings. In a different way, a thin metal film beforehand provided with openings may be laminated on the photoelectric conversion layer.

For forming fine openings on the light-incident side electrode, any method can be selected to use. For example, in a generally known method, an etching procedure is carried out by use of an electron beam exposure system capable of forming a super-fine structure. However, if this method is adopted, there is a fear that the production cost increases. In contrast, the fine openings can be formed at low cost according to the following methods, such as (A) a method comprising:
coating a resist on a thin metal film intended to be an electrode, to form a resist layer;
forming a mono-particle layer of fine particles on the resist layer,
etching the resist layer by use of the mono-particle layer as an etching mask, to form a resist pattern having openings corresponding to the aimed fine openings,
filling the openings in the resist pattern with inorganic substance, to form a reverse pattern mask, and
etching the thin metal film by use of the reverse pattern mask, to form fine openings;

(B) a method comprising:
coating a block copolymer-containing composition on a thin metal film intended to be an electrode, to form a block copolymer layer,
forming microdomains of the block copolymer in a dot pattern, and
etching the thin metal film by use of the dot pattern of the formed microdomains, to form fine openings; and (C) a method comprising
preparing a stamper whose surface has a fine relief pattern corresponding to the shape of the light-incident side electrode intended to be formed,
transferring a resist pattern onto a thin metal film intended to be an electrode by use of the stamper, and forming the pattern on the thin metal film by use of the resist pattern.

Those methods are explained below by referring to the attached drawings.

(A) The Method Employing Fine Particles as a Mask

As an embodiment of the present invention, the method for producing a solar cell by use of fine particles is described below by referring to FIG. 3.

First, as shown in FIG. 3A, a p-type semiconductor substrate of single crystal silicon is prepared as a semiconductor substrate. In the case where a p-type silicon substrate is used, the substrate doped with impurities such as boron can be employed. In the present invention, the semiconductor substrate may be made of poly-crystal silicon and may be doped with known impurities other than boron.

Subsequently, an $n^+$ layer 302 containing many n-type impurity elements such as phosphorus is formed on one of the major faces of the p-type semiconductor substrate 301. The $n^+$ layer 302 can be formed by a thermal diffusion method in which the n-type impurity elements are diffused.

On the other surface of the p-type semiconductor substrate 301, metals such as Au/Zn are vapor-deposited in vacuum to form a counter electrode layer 304. This counter electrode layer 304 of Au/Zn may also function as an anti-reflection layer.

Thereafter, on the sunlight-incident side surface of the $n^+$ layer 302, a light-incident side electrode 305A having fine openings is formed.

The light-incident side electrode has, for example, a nano-mesh structure made of aluminum. The light-incident side electrode can be formed, for example, by a method comprising the steps of: forming a mono-particle layer in which fine particles are aligned in a closest packing arrangement on a substrate; and shaving the aligned nano-particles by etching to a desired size, so as to form a dot pattern. The formed dot pattern is transferred onto a thin metal layer 305, which can be used as the light-incident side electrode 305A having fine openings. This method for forming a light-incident side electrode is described below in detail.

First, on a major face of the $n^+$ layer, aluminum or the like is vapor-deposited in vacuum to form a thin metal layer 305 (FIG. 3A).

Subsequently, a resist composition is coated on the thin metal layer 305, and heated to undergo heat-hardening reaction to form a resist layer 306.

Thereafter, the surface of the resist layer 306 is subjected to reactive etching, and thereby the surface becomes hydrophilic enough to have good wettability in the next step of coating the dispersion described below (FIG. 3B). In other words, the layer having the hydrophilized surface functions in the following step as a trap layer for catching fine silica particles. The trap layer may be formed, for example, by coating the resist layer with an organic polymer.

The substrate having the above resist layer formed thereon is then coated with a dispersion containing, for example, fine silica particles of 200 nm size to form a dispersion layer 309 (FIG. 3C), and subjected to anneal treatment. In the anneal treatment, only the silica particles positioned in the bottom of a particle stack are sunk into the above resist layer having the hydrophilized surface (FIG. 3D). After that, the substrate is cooled to room temperature, so as to harden the resist layer.

As a result, only the silica particles positioned in the bottom of a particle stack are captured on the substrate surface to form a mono-particle layer (FIG. 3E). Here, by way of example, silica particles are employed as the fine particles, but any organic or inorganic fine particles can be used as long as they can be etched in a rate different from the resist layer, as described later. The size of the fine particles depends on the pattern of the light-incident side electrode, but is generally 100 to 700 nm.

The mono-particle layer of fine silica particles thus formed is then subjected to etching (FIG. 3F), to reduce the size thereof and accordingly to expand intervals among the particles. The etching conditions are so selected that the underlying resist layer may not undergo the etching. Since the particles and the resist layer are etched in different rates, it is possible to etch only the silica particles so as to form intervals among them.

After that, the underlying thermosetting resist layer is subjected to etching by use of the remaining fine silica particles as an etching mask.

In the above manner, a resist pattern 306A can be obtained. The obtained pattern has columns of high aspect ratio at the positions previously occupied by the remaining fine silica particles in the former step (FIG. 3G).

Subsequently, the obtained columnar resist pattern is coated with a spin-on-glass (hereinafter, referred to as SOG) solution, followed by heating, so that the intervals among the columns of the resist pattern are filled with SOG.

Thereafter, the remaining silica particles and excess SOG covering the columnar resist pattern are removed by etching, to form a columnar resist pattern including SOG 309 filling the intervals among the columns 306A (FIG. 3H).

The columns 306A of thermosetting resist are then removed by etching. In this step, a SOG mask 309A having a pattern structure in reverse to the above columnar resist pattern is formed on the metal thin layer 305 (FIG. 3I).

Finally, the metal thin layer 305 is subjected to etching by use of the SOG mask 309A as a mask. In this way, a light-incident side electrode 305A having fine openings is formed on the aforementioned n⁺ layer. A solar cell according to an embodiment of the present invention can be thus obtained (FIG. 3J).

(B) The Method Employing Block Copolymer

As another embodiment of the present invention, the method for producing a solar cell by use of a block copolymer is explained by referring to FIG. 4.

First, an n⁺ layer 402 is formed on one surface of a p-type semiconductor substrate 401 to produce a photoelectric conversion layer 403. After that, on the other surface of the p-type semiconductor substrate 401, metals are vapor-deposited in vacuum to form a counter electrode layer 404.

Figure 4A:
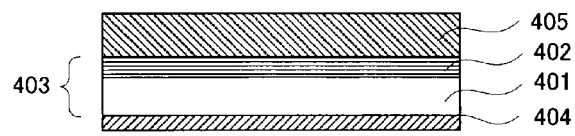
FIGS. 4A to 4G show schematic sectional views illustrating another process for producing a solar cell according to an embodiment of the present invention.

On the n⁺ layer of the photoelectric conversion layer 403, a resist composition is coated and heated to undergo heat-hardening reaction to form a resist layer 405 (FIG. 4A).

Figure 4F:
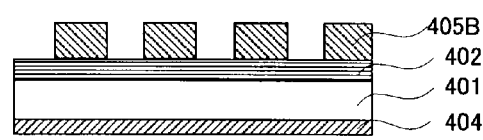
Figure 4B:
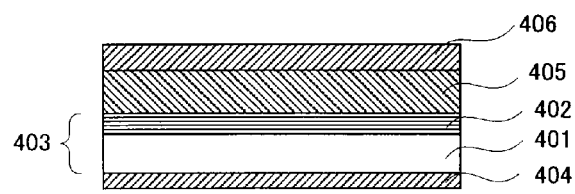

The substrate coated with the above resist is further coated with a SOG solution, followed by heating, to form a SOG layer 406 (FIG. 4B).

Figure 4G:
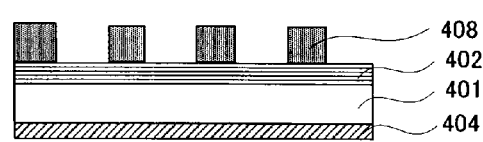
Figure 4C:
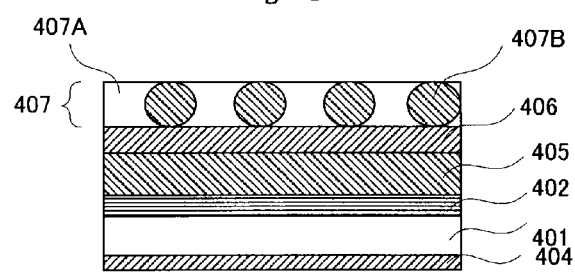

Subsequently, a diblock copolymer solution comprising a diblock copolymer of polystyrene/polymethyl methacrylate and a homo-polymer of polymethyl methacrylate is prepared. The solution is then coated on the above substrate to form a diblock copolymer layer 407. The diblock copolymer layer is heated to cause phase separation of the diblock copolymer and thereby to obtain a morphology in which the polystyrene forms a dot pattern of microdomains 407B in polymethyl methacrylate matrix 407A (FIG. 4C). The diblock copolymer is not restricted to polystyrene/polymethyl methacrylate. Other examples of the diblock copolymer include: diblock copolymers of polystyrene and acrylic resins such as polystyrene/polybutyl (meth)acrylate and polystyrene/polyhexyl (meth)acrylate; and diblock copolymers of polystyrene and rubbers such as polystyrene/polyethylene oxide, polystyrene/polybutadiene, and polystyrene/polyisoprene. The polystyrene in the above copolymers can be replaced with, for example, poly-α-methyl-styrene, polyvinylnaphthalene, polyvinylpyridine, polyhydroxy-styrene or the like. Those polymers are disclosed in JP-A 2001-151834 (KOKAI) by the present inventors.

Figure 4D:
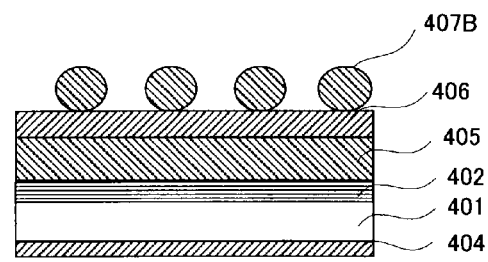
Figure 4E:
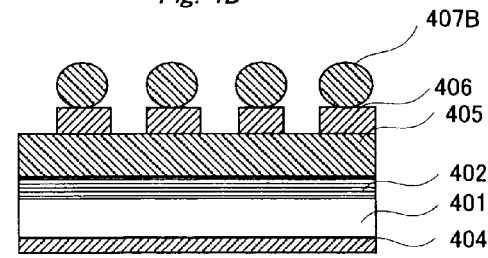

Thereafter, the diblock copolymer layer 407 is subjected to etching, so as to selectively remove the polymethyl methacrylate matrix. The etching conditions are so selected that the dots of polystyrene 407B may not undergo the etching. The SOG layer in the areas among the dots of polystyrene is bared in this step (FIG. 4D). After that, the SOG layer is then subjected to etching by use of the remaining polystyrene dots as a mask. As a result of this etching procedure, the SOG layer in the areas previously occupied by the polymethyl methacrylate matrix in the former step is selectively etched and consequently the dot pattern of polystyrene is transferred onto the SOG layer. Thus, a SOG pattern 405B corresponding to the phase separation of block copolymer is formed (FIG. 4E). Subsequently, the underlying resist layer is subjected to etching by use of the SOG pattern 405B as a mask, to form a columnar pattern 405B having columns at the positions previously occupied by the polystyrene in the former step (FIG. 4F).

On the obtained columnar pattern, metals such as aluminum are vapor-deposited by a resistance heat deposition method.

Finally, the columnar pattern is removed to form a light-incident side electrode 408 having desired openings. A solar cell according to an embodiment of the present invention can be thus obtained (FIG. 4G).

(C) The Method of Nano-Imprint

As still another embodiment of the present invention, the method for producing a solar cell by use of nano-imprint is explained by referring to FIG. 5.

Figure 5A:
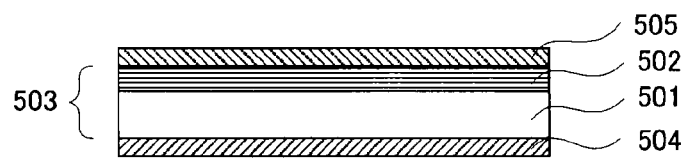
FIGS. 5A to 5E show schematic sectional views illustrating still another process for producing a solar cell according to an embodiment of the present invention.

First, in the same manner as in (A), an n⁺ layer 502 is formed on one surface of a p-type semiconductor substrate 501 to produce a photoelectric conversion layer 503. After that, on the back surface of the photoelectric conversion layer, a thin metal layer is formed to produce a counter electrode layer 504. On the n⁺ layer of the photoelectric conversion layer 503, aluminum is vapor-deposited to form anther thin metal layer 505 (FIG. 5A).

Figure 5B:
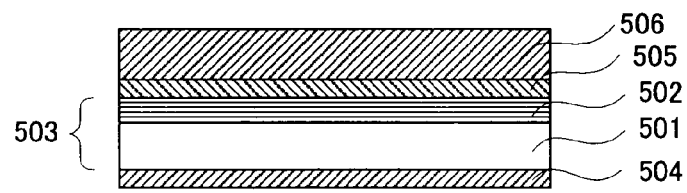

On the thin metal layer 505, a resist composition is coated and heated to undergo heat-hardening reaction to form a resist layer 506 (FIG. 5B).

Figure 5C:
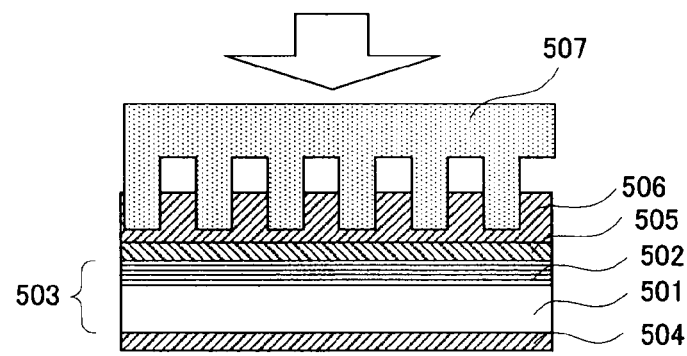

Subsequently, a fine relief pattern corresponding to the openings of the present invention is transferred onto the resist layer 506 by use of a stamper 507 as a mold (FIG. 5C).

The stamper can be obtained, for example, by an electron beam lithographic process in which a desired structure can be formed on a quartz plate. However, in the method of the present invention for producing a solar cell, there is no particular restriction on the material and production process of the stamper. For example, the stamper can be formed according to the above-described method employing fine particles or block copolymer.

Figure 5D:
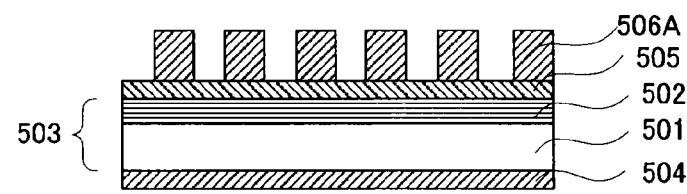
Figure 5E:
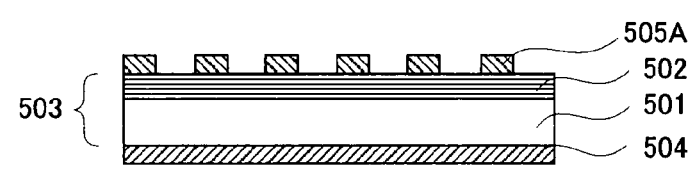

The stamper is pressed onto the resist layer, if necessary, while heated, and then cooled and released therefrom, so that a pattern in reverse to the relief pattern of the stamper is transferred on the resist layer. In this way, a resist pattern having columns 506A and openings among them is obtained (FIG. 5D).

The present invention is not restricted to the thermal nano-imprinting process described above. Various imprinting techniques such as photo imprint and soft imprint can be used to form the above pattern, and they by no mean impair the functions of the solar cell according to the present invention.

Finally, the thin metal layer 505 is subjected to etching by use of the obtained resist pattern as a mask, to bore openings though the metal layer. A solar cell according to an embodiment of the present invention can be thus obtained (FIG. 5C).

Besides the methods (A) to (C), the light-incident side electrode can be also produced by another process in which a pattern of resist or of inorganic substance is formed on the photoelectric conversion layer before the thin metal layer is formed, and then metals are accumulated on spaces in the pattern by vapor deposition. In this process, the pattern of resist or of inorganic substance is removed by etching or ashing, and bottoms of the formed openings are further removed by etching or the like. A solar cell according to an embodiment of the present invention can be also thus obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

The present invention is further explained by the following examples, which by no means restrict the present invention.

Example 1

Amorphous Silicon Type Solar Cell

The following example explains a process for producing an amorphous silicon type solar cell as an embodiment of the present invention. FIG. 6 shows schematic sectional views of a solar cell comprising a light-incident side electrode layer provided with openings according to the present invention.

Differing from a solar cell of crystalline silicon, an amorphous silicon type solar cell has a large light-absorbance and hence the light-absorption layer thereof can be thinned down. On the other hand, however, if a simple pn-junction is employed, it is known that carrier trap and recombination are liable to occur because of structure defects and the like. In view of that, the amorphous silicon type solar cell often has a pin-structure in which an i-layer of non-doped silicon is formed between a p-type silicon layer and an n-type silicon layer. When the i-layer receives light, carriers are separated into holes and electrons. Since an electric field is applied to the i-layer, the holes and electrons are moved to the n- and p-layers, respectively, to generate electromotive force. As described above, in the amorphous silicon type solar cell, it is preferred to form electrodes on the whole surface so that they can keep in contact with the whole surface of the photoelectric conversion layer. The metal electrode thus keeps in direct contact with the photoelectric conversion layer, and has such a particular structure of the present invention as enhances the electric field. Consequently, the conversion efficiency is so remarkably improved that the amorphous silicon type solar cell can be made ½ to ¹⁄₁₀ as thin as a conventional crystalline silicon type solar cell.

Figure 6A:
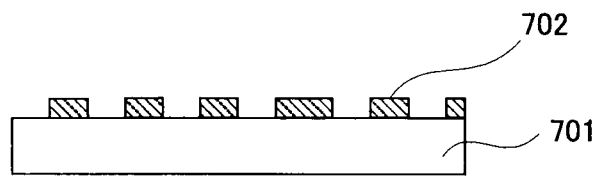
FIGS. 6A to 6C show schematic sectional views illustrating a process for producing the solar cell of Example 1.

In the first step, a metal electrode 702 having the particular structure of the present invention was formed on a glass substrate 701 of light-transparency (FIG. 6A). The light-transmission type metal electrode layer 702 was produced by the method employing block copolymer. The produced metal electrode layer was made of aluminum and was in the form of a mesh structure having a thickness of 50 nm, an average opening area of $9.8 \times 10^3$ nm$^2$ (opening diameter: 112 nm) and an average opening ratio of 28.4%.

Figure 6B:
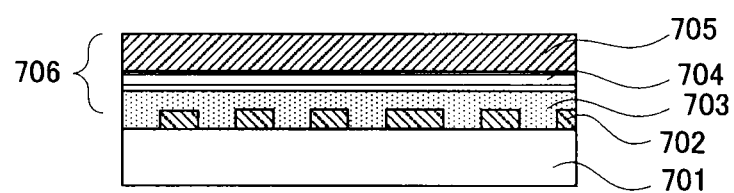
Figure 6C:
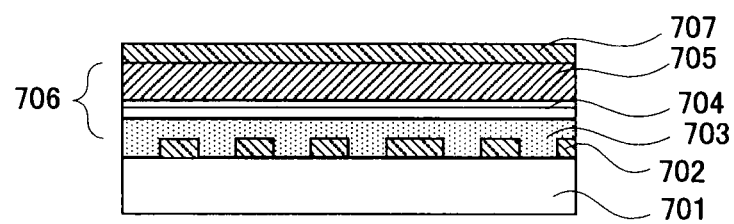

The obtained transparent substrate was then placed in an individual formation type plasma CVD apparatus, and amorphous silicon layers such as an n-layer 703, an i-layer 704 and a p-layer 705 were formed under atmospheres of gases properly selected depending on properties required to individual layers. The n-, i- and p-layers, which were n-type, i-type and p-type silicon layers, respectively, were accumulated and formed in order under atmospheres of $B_2H_6/SH_4$ mixed gas, of $SH_4$ gas, and of $PH_3/SiH_4$ mixed gas, respectively, to produce a photoelectric conversion layer (FIG. 6B). Each layer was formed in a different independent chamber to avoid contamination. Subsequently, the sample was taken out from the CVD apparatus, and then placed in a sputtering apparatus to form an ITO layer 707 on the n-layer by sputtering (FIG. 6C).

A light-transmission type solar cell of amorphous silicon was thus obtained. While the obtained solar cell was exposed to pseudo-sunlight of AM 1.5, the properties thereof at room temperature were evaluated by means of a solar simulator (low-energy spectral sensitivity measurement apparatus, manufactured by MAKI manufacturing Co., Ltd.). As a result, it was found that the conversion efficiency and the transmittance at 700 nm were 7.5% and 15%, respectively. They were favorable values.

Example 2

Figure 7A:
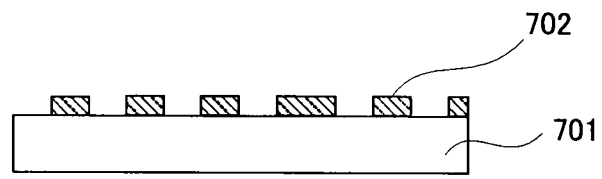
FIGS. 7A to 7D show schematic sectional views illustrating a process for producing the solar cell of Example 2.
Figure 7B:
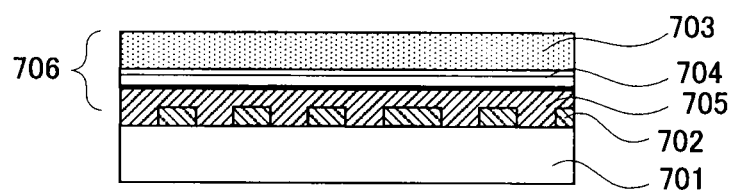

A first metal electrode 702 having the particular structure of the present invention was formed on a glass substrate 701 of light-transparency (FIG. 7A). The first light-transmission type metal electrode layer 702 was produced by the method employing block copolymer. The produced metal electrode layer was made of aluminum and was in the form of a mesh structure having a thickness of 50 nm, an average opening area of $9.8 \times 10^3$ nm$^2$ (opening diameter: 112 nm) and an average opening ratio of 28.4%.

Figure 7C:
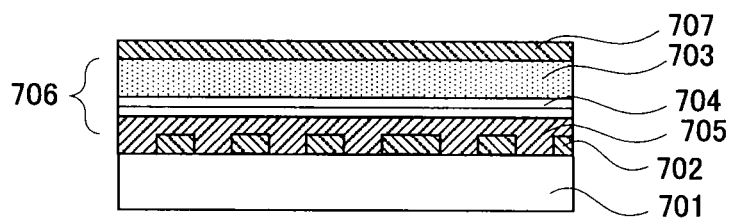

The obtained transparent substrate was then placed in an individual formation type plasma CVD apparatus, and amorphous silicon layers such as a p-layer 705, an i-layer 704, and an n-layer 703 were accumulated and formed in order under atmospheres of gases properly selected depending on properties required to individual layers, to produce a photoelectric conversion layer. Each layer was formed in a different independent chamber to avoid contamination. Subsequently, aluminum was vapor-deposited in a thickness of 50 nm in an EB deposition apparatus to form a thin metal layer 707 (FIG. 7C).

Figure 7D:
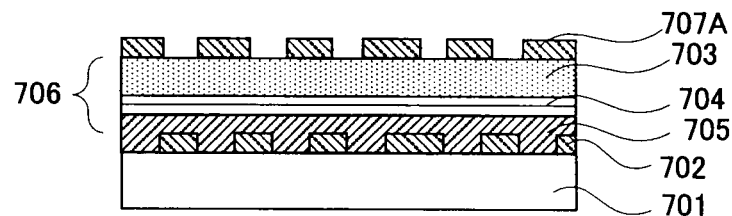

Independently, a mold was produced according to the aforementioned method employing fine particles as a mask. By use of the produced mold, a nickel stamper was produced by electroplating. Subsequently, a resist was coated on the substrate having the thin metal layer 707 formed thereon, and then the stamper was pressed thereon to form a resist pattern according to the thermal nano-imprinting process. After the resist pattern was formed by nano-imprinting, a second light-transmission type metal electrode layer 707A was produced by ICP-RIE (inductive coupled plasma-reactive ion etching)

under an atmosphere of chlorine gas (FIG. 7D). The produced metal electrode layer was made of aluminum and was in the form of a mesh structure having a thickness of 50 nm, an average opening area of $1.3 \times 10^5$ nm$^2$ (opening diameter: 400 nm) and an average opening ratio of 38%.

On the second metal electrode layer, an oxide layer was further accumulated by CVD, to obtain a light-transmission type solar cell.

In the same manner as in Example 1, the properties of the obtained solar cell at room temperature were evaluated while pseudo-sunlight of AM 1.5 was applied onto the solar cell from the first light-incident side metal electrode layer. As a result, it was found that the conversion efficiency and the transmittance at 700 nm were 8.3% and 13%, respectively. They were favorable values.

The invention claimed is:

1. A solar cell comprising:
a photoelectric conversion layer comprising at least p-type semiconductor and n-type semiconductor and having a thickness of 500 nm or less, wherein the semiconductor is selected from the group consisting of single crystal silicon, poly-crystal silicon, and amorphous silicon,
a light-incident side electrode layer comprising a thin metal film formed on a light-incident surface of said photoelectric conversion layer, and
a counter electrode layer formed on the surface opposite to the light-incident surface;
wherein
said light-incident side electrode layer and/or said counter electrode layer has plural openings bored there-through where an average length of unbroken metal between two adjacent openings is in the range of 10 nm to 200 nm, and the thickness of the light-incident side electrode layer is in the range of 10 nm to 200 nm,
each of said openings occupies an area of 80 nm$^2$ to 0.8 µm$^2$, and the opening ratio is in the range of 10% to 66%, said opening ratio being defined as the ratio of the total area of the openings based on that of said light-incident side electrode layer having plural openings, and
light of 700 nm wavelength can penetrate in a transmittance of 5% or more from said light-incident side electrode layer through said counter electrode layer.

2. The solar cell according to claim 1, wherein a depletion layer is at least partly positioned within a distance of 500 nm from the contact surface between said light-incident side electrode layer and said photoelectric conversion layer.

3. The solar cell according to claim 1, wherein said light-incident side electrode layer is made of a material selected from the group consisting of aluminum, silver, gold, platinum, nickel, cobalt, chromium, copper and titanium.

4. The solar cell according to claim 1, wherein said photoelectric conversion layer comprises single crystal silicon or poly-crystal silicon and has a thickness of 20 to 200 nm.

5. The solar cell according to claim 1, wherein said photoelectric conversion layer comprises amorphous silicon and has a thickness of 10 to 500 nm.

6. A solar cell comprising:
a photoelectric conversion layer comprising at least p-type semiconductor and n-type semiconductor and having a thickness of 500 nm or less, wherein the semiconductor is selected from the group consisting of single crystal silicon, poly-crystal silicon, and amorphous silicon,
a light-incident side electrode layer comprising a thin metal film formed on a light-incident surface of said photoelectric conversion layer, and
a counter electrode layer formed on the surface opposite to the light-incident surface;
wherein
said light-incident side electrode layer and said counter electrode layer has plural openings bored there-through where an average length of unbroken metal between two adjacent openings is in the range of 10 nm to 200 nm, and the thickness of the light-incident side electrode layer is in the range of 10 nm to 200 nm,
each of said openings occupies an area of 80 nm$^2$ to 0.8 µm$^2$, and the opening ratio is in the range of 10% to 66%, said opening ratio being defined as the ratio of the total area of the openings based on that of said light-incident side electrode layer having plural openings, and
light of 700 nm wavelength can penetrate in a transmittance of 5% or more from said light-incident side electrode layer through said counter electrode layer.

* * * * *